(12) United States Patent
Toyoda

(10) Patent No.: US 7,507,519 B2
(45) Date of Patent: *Mar. 24, 2009

(54) PATTERN FORMING METHOD, WIRING PATTERN FORMING METHOD, ELECTRO-OPTICAL DEVICE, AND ELECTRONIC APPARATUS

(75) Inventor: Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 592 days.

This patent is subject to a terminal disclaimer.

(21) Appl. No.: 10/898,338

(22) Filed: Jul. 26, 2004

(65) Prior Publication Data

US 2005/0042430 A1 Feb. 24, 2005

(30) Foreign Application Priority Data

Aug. 8, 2003 (JP) .............................. 2003-290657

(51) Int. Cl.
*G03F 7/00* (2006.01)
*G03C 11/00* (2006.01)

(52) U.S. Cl. ................ 430/198; 430/311; 430/321; 430/330; 430/945; 264/400; 505/410; 505/412; 505/413

(58) Field of Classification Search ................ 430/330, 430/198, 311, 321, 964, 945; 438/708, 612; 505/410, 412, 413; 264/400
See application file for complete search history.

(56) References Cited

U.S. PATENT DOCUMENTS

| 4,943,681 | A * | 7/1990 | Sato et al. .............. 430/270.17 |
| 7,094,641 | B2 * | 8/2006 | Toyoda ...................... 438/222 |
| 7,105,264 | B2 * | 9/2006 | Toyoda ...................... 430/198 |
| 7,172,912 | B2 * | 2/2007 | Toyoda ....................... 438/30 |
| 2006/0003262 | A1 * | 1/2006 | Yang et al. .................. 430/311 |

FOREIGN PATENT DOCUMENTS

| JP | A-9-130048 | 5/1997 |
| JP | 10-168386 | 6/1998 |
| JP | 2000-232883 | 8/2000 |
| JP | 2000-282240 | 10/2000 |
| KR | 10-0349282 | 4/2001 |

* cited by examiner

*Primary Examiner*—Thorl Chea
(74) *Attorney, Agent, or Firm*—Oliff & Berridge, PLC

(57) ABSTRACT

Aspects of the invention can provide a patterning forming method capable of patterning a thin film by a simple and inexpensive device. The thin film can be provided on a base member including a photothermal conversion material that converts optical energy into thermal energy and light is radiated onto the base member to remove the thin film corresponding to a light-radiated region, such that the thin film is patterned.

8 Claims, 12 Drawing Sheets

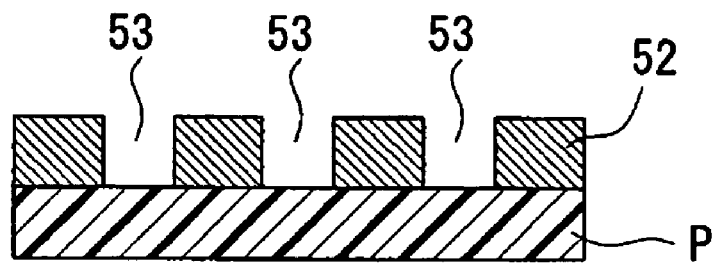
FIG. 10 (a)
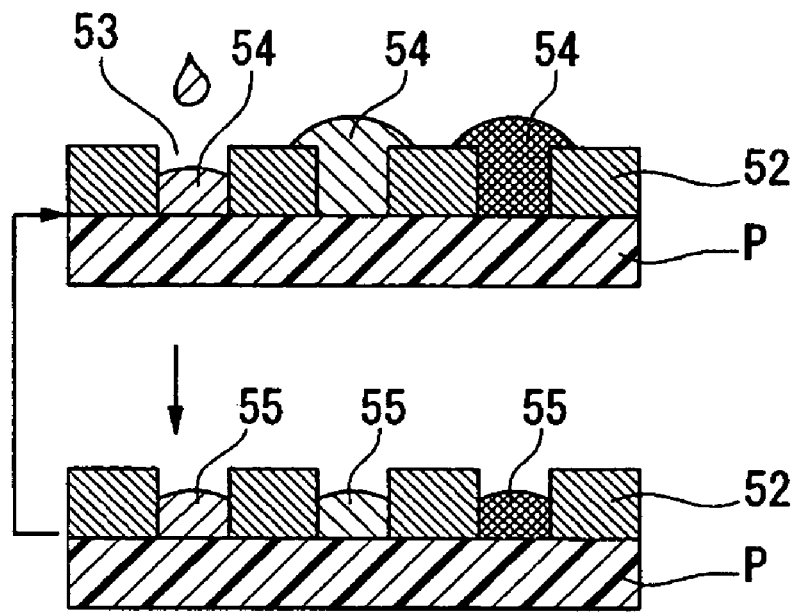
FIG. 10 (b)
FIG. 10 (c)
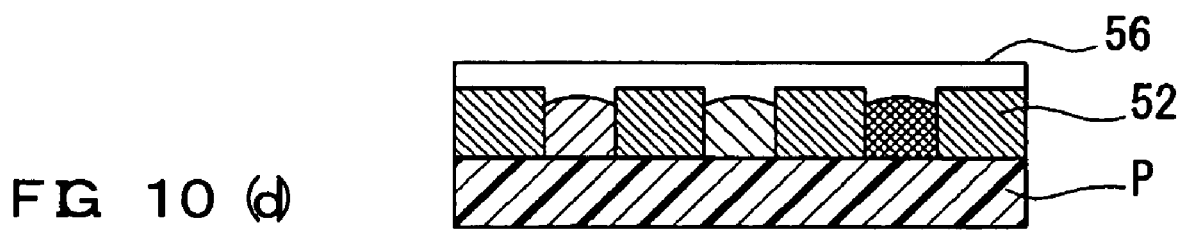
FIG. 10 (d)
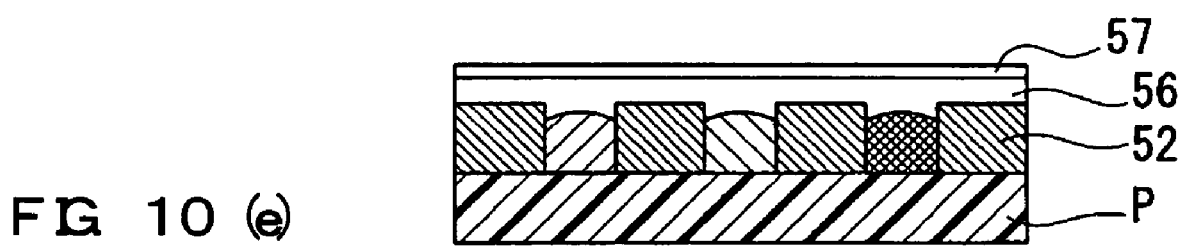
FIG. 10 (e)
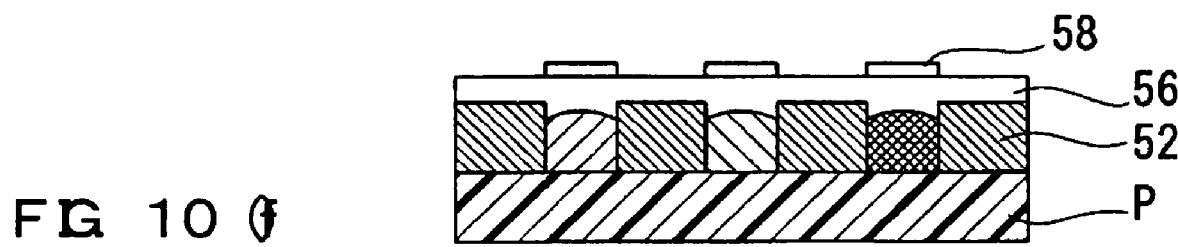
FIG. 10 (f)

PATTERN FORMING METHOD, WIRING PATTERN FORMING METHOD, ELECTRO-OPTICAL DEVICE, AND ELECTRONIC APPARATUS

BACKGROUND OF THE INVENTION

1. Field of Invention

Aspects of the invention relate to a pattern forming method of forming a thin film pattern on a base member, a wiring pattern forming method using the thin film pattern, an electro-optical device, and an electronic apparatus.

2. Description of Related Art

Related methods of manufacturing devices having minute wiring patterns, such as semiconductor integrated circuits, the photolithography method has been widely used, and device manufacturing methods using a liquid droplet ejecting method (an inkjet method) have also been of interest. When the minute wiring patterns are formed using the liquid droplet ejecting method, a method of patterning a lyophobic region and a lyophilic region on a base member 1n advance so as to enhance precision of the pattern line width and selectively arranging droplets on the lyophilic region has been suggested. Further, for example in Japanese Unexamined Patent Application Publication No. 2000-282240, a technique of patterning a monolayer provided on a substrate by a chemical vapor deposition (CVD) method is disclosed.

However, the aforementioned related arts have the following disadvantages. According to the technology disclosed above, ultraviolet (UV) rays or an electronic beam is radiated onto the substrate to remove the monolayer from the substrate such that patterning is performed, which requires an expensive and large device.

SUMMARY OF THE INVENTION

An aspect of the invention can provide a pattern forming method capable of patterning a thin film by a simplified and inexpensive device. In addition, it is another object of the invention to provide a wiring pattern forming method of forming a wiring pattern using the thin film, an electro-optical device having the wiring pattern, and an electronic apparatus.

The invention can include a pattern forming method of providing a thin film on a base member 1ncluding a photothermal conversion material that converts optical energy into thermal energy and of radiating light onto the base member to remove the thin film from the base member corresponding to a light-radiated region so that the thin film is patterned. Here, the thin film may be made of one of an organic thin film, a monolayer, and a monomer including a photoinitiator. According to the invention, it can be possible to effectively convert the optical energy of the radiated light into thermal energy and to apply the thermal energy to the thin film by providing a photothermal conversion material on the base member. Thus, it is possible to obtain enough thermal energy for removing the thin film without using electronic beam or UV rays according to the conventional technology. Accordingly, it is possible to use various light radiating devices and to thus effectively remove the thin film from the base member by enough thermal energy without using an expensive and large light radiating device such that patterning is performed.

According to the exemplary pattern forming method of the invention, a photothermal conversion layer including the photothermal conversion material may be independent of the base member and the thin film. The photothermal conversion material may be mixed into the base member. In either case, it is possible to convert the optical energy of the radiated light into thermal energy and to apply the thermal energy to the thin film. When the photothermal conversion layer is independent of the base member and the thin film, the photothermal conversion layer may be provided on one surface side of the base member on which the thin film is provided and may be provided on the other surface side of the base member on which the thin film is not provided. When the photothremal conversion layer is provided on the one surface side of the base member on which the thin film is provided, it is possible to effectively expose the thin film to the outside by providing the photothermal conversion layer between the base member and the thin film to expose the thin film to the outside.

In the pattern forming method according to the invention, the light may be radiated from one surface side of the base member on which the thin film is provided, and the light may be radiated from the other surface side of the base member on which the thin film is not provided. When the light is radiated from the one surface side, the light can be radiated to the thin film or the photothermal conversion layer without passing through the base member, so that the light can be radiated to desired positions without generating variation of the light-radiated position due to diffraction or scattering of light resulting from interposing the base member and thus the thin film can be patterned. Further, when the light is radiated from the other surface side, the light can be radiated directly to the photothermal conversion layer through the base member by providing the photothermal conversion layer between the base member and the thin film, so that the optical energy can be efficiently converted into the thermal energy and the thermal energy can be supplied to the thin film. In this case, part of the thin film to which the thermal energy has been supplied is smoothly discharged externally.

According to the pattern forming method of the invention, it may be determined from which side between the one surface side of the base member and the other surface side of the base member light is to be radiated in accordance with the thin film. For example, in the case where the thin film is made of a material that absorbs the wavelength of the radiated light and the photothermal conversion layer is provided under the thin film, when light is directly radiated onto the thin film from above the thin film, the light may be absorbed into the thin film not to reach the photothermal conversion layer under the thin film. In such a case, the light is preferably radiated from below the thin film (the other surface side of the base member).

In the pattern forming method according to the invention, the light may be a laser beam, and light having a wavelength corresponding to the photothermal conversion material may be radiated. As a result, the optical energy applied to the photothermal conversion material can be efficiently converted into the thermal energy. In particular, infrared laser beam may be used as light to obtain a relatively inexpensive device.

In the exemplary pattern forming method according to the invention, the light may be radiated to the base member through a mask having a predetermined pattern. As a result, minute thin film patterns smaller than a beam diameter of the radiated light can be formed. On the other hand, the light radiation may be performed while relatively moving the base member with respect to the light. That is, the thin film patterns may be drawn while relatively moving the radiated light (laser beam) and the base member, and in this construction, a process of manufacturing the mask can be omitted.

Further, according to another aspect of the invention, there is also provided a wiring pattern forming method of forming the wiring patterns by arranging liquid droplets containing a wiring pattern forming material on the base member having the thin film pattern formed using the aforementioned pattern forming method. According to the present invention, by utilizing the liquid droplet ejecting method, it is possible to form the minute wiring patterns well while preventing waste of the material to be consumed.

Further, according to another aspect of the invention, there is also provided an electro-optical device having the wiring patterns formed on the base member using the wiring pattern forming method. According to another aspect of the invention, there is also provided an electronic apparatus comprising the aforementioned electro-optical device. According to the invention, since the minute wiring patterns formed using the liquid droplet ejecting method can be provided, it is possible to provide an electro-optical device and an electronic apparatus having the electro-optical device, which can achieve desired performance. Further, examples of the electro-optical device may include a liquid crystal display device, an organic EL (Electroluminescence) display device, and a plasma display device.

It is possible to form respective components, such as a color filter, a liquid crystal display device, an organic EL device, a plasma display device, a micro lens, and a DNA chip using a thin film pattern formed by the pattern forming method according to the present invention.

The aforementioned liquid droplet ejecting method is embodied using a liquid droplet ejecting apparatus that can include an ejecting head and the liquid droplet ejecting apparatus that includes an inkjet apparatus having an inkjet head. The inkjet head of the inkjet apparatus can quantitatively eject liquid droplets of a liquid material including a functional solution by using the inkjet method, and can quantitatively and intermittently drop a liquid material of, for example, 1 to 300 ng per dot. The liquid droplet ejecting apparatus may be a dispenser.

The liquid material can be a medium having viscosity capable of being ejected (dropped) from ejecting nozzles of the ejecting head of the liquid droplet ejecting apparatus. Whether the liquid material is aqueous or oily is irrelevant. It is sufficient as long as the liquid material has fluidity (viscosity) capable of being ejected from the ejecting nozzles, and even when a solid material is mixed thereto, it is sufficient as long as they form a fluid as a whole. The material contained in the liquid material may be heated and dissolved at a temperature higher than a melting point, may be mixed as fine particles in a solvent, and dyes, pigments, or other functional materials may be added thereto in addition to the solvent.

Further, the functional solution can be a liquid material containing a functional material, and that performs a predetermined function through arrangement on the base member. Examples of the functional material may include a liquid crystal display device forming material used for forming a liquid crystal display device including a color filter, an organic EL display device forming material used for forming an organic EL (Electroluminescence) display device, a plasma display device forming material used for forming a plasma display device, and a wiring pattern forming material containing metal for forming a wiring pattern for supplying power, and so on.

BRIEF DESCRIPTION OF THE DRAWINGS

This invention will be described with reference to the accompanying drawings, wherein like numerals reference like elements, and wherein:

FIG. 10(a-f) is a diagram illustrating an example of an electro-optical device manufactured using the thin film formed through the pattern forming method according to the invention, where an example of processes of forming a color filter of a liquid crystal display device is shown;

DETAILED DESCRIPTION OF PREFERRED EMBODIMENTS

Figure 1:
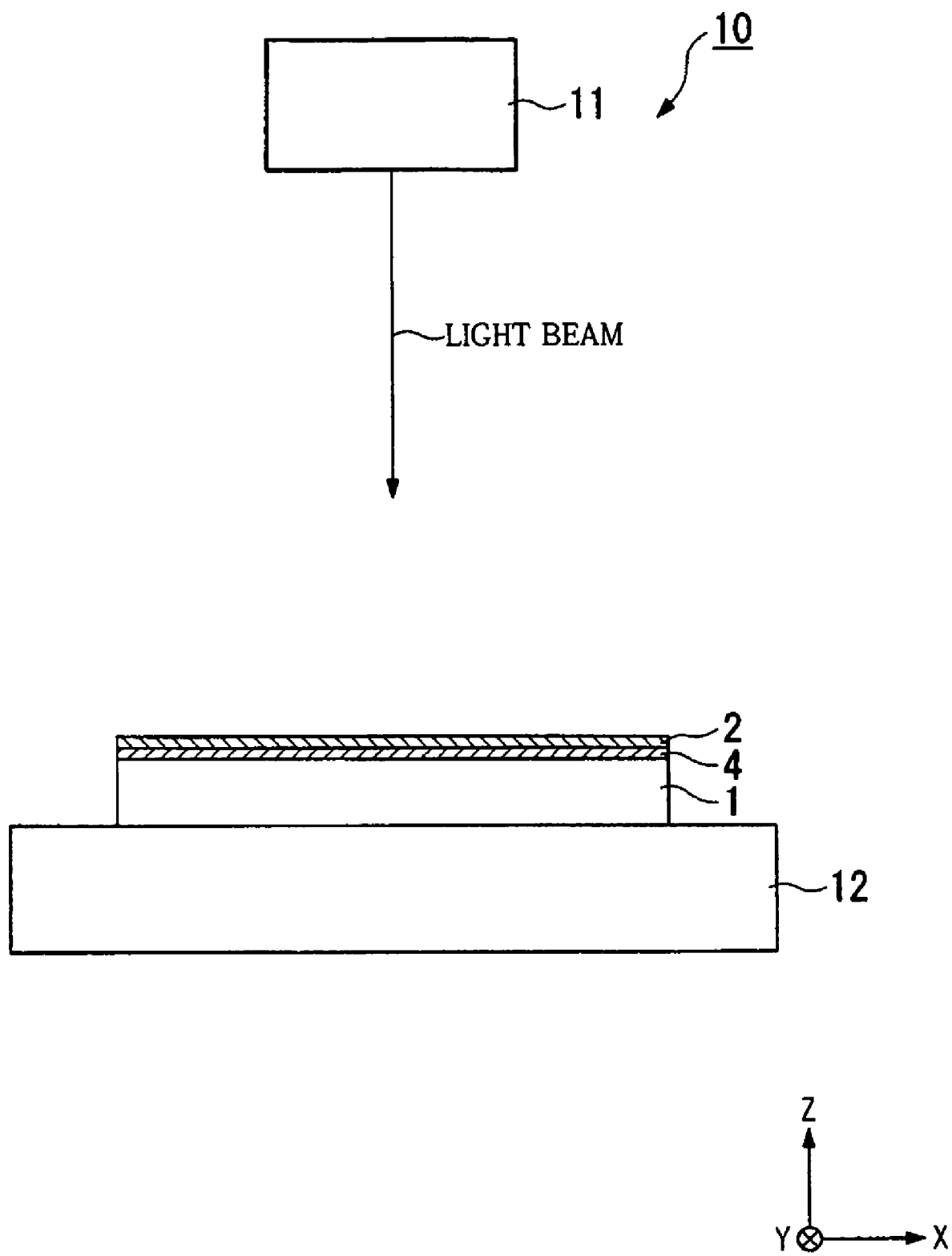
FIG. 1 is a schematic diagram illustrating an embodiment of a pattern forming apparatus used in a pattern forming method according to the invention.

Hereinafter, a pattern forming method according to the invention will be described with reference to the accompanying drawings. FIG. 1 is a schematic diagram illustrating an exemplary embodiment of a pattern forming apparatus used in the thin film pattern forming method according to the invention. In FIG. 1, the pattern forming apparatus 10 can include a laser source 11 for radiating a laser beam having a predetermined wavelength and a stage 12 for supporting a base member 1 which is a processing target. A photothermal conversion layer 4 is provided on the surface of the base member 1 and a thin film 2 is provided on the photothermal conversion layer 4. In this exemplary embodiment, a near-infrared semiconductor laser (with a wavelength of 830 nm) is used as the laser source 11.

In the following description, it is assumed that a predetermined direction in a horizontal plane is an X axis direction, a direction perpendicular to the X axis direction in the horizontal plane is a Y axis direction, and a direction (a vertical direction) perpendicular to the X axis direction and the Y axis direction is a Z axis direction.

The stage 12 is provided to be movable in the X axis direction and the Y axis direction while supporting the base member 1, and the base member 1 is movable with respect to the light beam radiated from the light source 11 through movement of the stage 12. Further, the stage 12 is movable in the Z axis direction. Here, an optical system not shown is disposed between the light source 11 and the base member 1 supported by the stage 12.

The stage 12 supporting the base member 1 can adjust the position of the base member 1 with respect to the focus of the optical system through movement thereof in the Z axis direction. In addition, the light beam radiated from the light source 11 irradiates the base member 1 (thin film 2 and photothermal conversion layer 4) supported by the stage 12.

For example, a glass substrate or a transparent polymer can be used as the base member 1. Examples of the transparent polymer may include polyester, such as polyethylene terephthalate, polyacryl, polyepoxy, polyethylene, polystyrene, polycarbonate, polysulfide, etc. When the base member 1 is formed out of the transparent polymer, the thickness thereof is preferably 10 to 500 μm. As a result, for example, the base member 1 can be formed in a belt shape and wound in a roll shape, so that the base member can be carried (moved) while the base member 1s held on a rotary drum, etc.

On the other hand, although the base member 1 is supported by the stage 12 which is linearly moved in the X and Y axis directions in this embodiment, the rotary drum can be movable in a horizontal direction (scanning direction, X axis direction), a rotational direction (Y axis direction), and a vertical direction (Z axis direction) while the base member 1 is held on the rotary drum.

The photothermal conversion layer 4 is independent of the base member 1 and the thin film 2. According to the exemplary embodiment, the photothermal conversion layer 4 is provided on the surface side of the base member 1 on which the thin film 2 is provided, to be specific, between the base member 1 and the thin film 2. The photothermal conversion layer 4 can include a photothermal conversion material that converts optical energy into thermal energy. Well-known materials can be used as the photothermal conversion material constituting the photothermal conversion layer 4, and it is not specifically limited if only the material can efficiently convert the laser beam into the heat. Examples of the photothermal conversion layer can include a metal layer made of aluminum, oxide thereof and/or sulfide thereof, an organic layer made of polymer to which carbon black, graphite, or infrared absorbing pigment is added, and so on. Examples of the infrared absorbing pigment can include anthraquinone, dithiol nickel complex, cyanine, azocobalt complex, diimmonium, squalelium, diphthalocyanine, naphthalocyanine, etc. By using synthetic resin, such as epoxy resin, as a binder and dissolving or dispersing the photothermal conversion material in the binder resin, the photothermal conversion material is provided on the base member 1. Of course, the photothermal conversion material may be provided on the base member 1 without dissolving or dispersing the photothermal conversion material in the binder.

When the metal layer is used as the photothermal conversion layer 4, the metal layer can be formed on the base member 1 by using a vacuum deposition method, an electronic beam deposition method, or a sputtering method. When the organic layer is used as the photothermal conversion layer 4, the organic layer can be formed on the base member 1 by using conventional film coating methods, such as an extrusion coating method, a spin coating method, a gravure coating method, a reverse roll coating method, a rod coating method, a micro gravure coating method, a knife coating method, and the like.

The thin film 2 is formed of an organic thin film on the photothermal conversion layer 4 (the base member 1) by a chemical vapor deposition method, a dipping method, a deposition method, a spin cast method, a chemical adsorption method, and a self-assembled monolayer forming method. According to the exemplary embodiment, the organic thin film 2 is formed of a monolayer made of fluoroalkylsilane (FAS). The monolayer may be made of octadecylamine used for a surface active agent.

In addition, the thin film 2 can be formed on the photothermal conversion layer 4 (base member 1) by using a conventional film coating method, such as an extrusion coating method, a spin coating method, a gravure coating method, a reverse roll coating method, a rod coating method, a micro gravure coating method, and the like. In the method of coating the thin film 2, it is preferable that the thin film-forming functional solution be uniformly formed on the base member 1 by eliminating static electricity charged on the surface of the base member 1 and it is also preferable that a static eliminator be provided in the apparatus used for each method.

Figure 2:
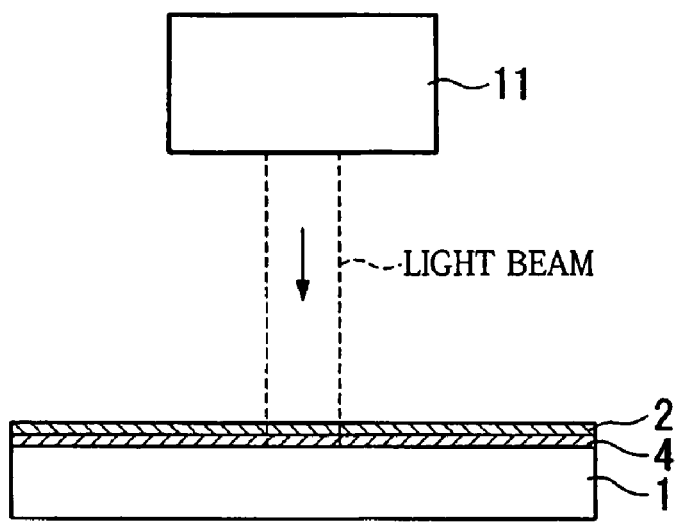
FIG. 2(a-b) is a schematic diagram illustrating an exemplary embodiment of the pattern forming method according to the invention.
Figure 2:
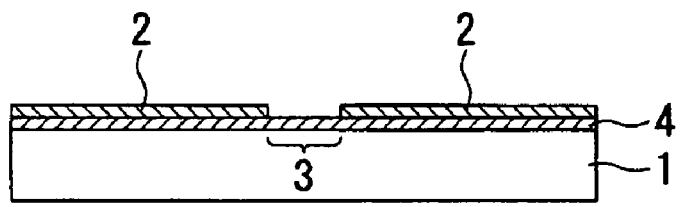

Next, the sequence of forming patterns will be described with reference to FIG. 2(a-b). As shown in FIG. 2(a), a laser beam having a predetermined beam diameter is radiated from the topside (surface) of the thin film 2 on the base member 1. The base member 1 and the photothermal conversion layer 4 on the base member 1 corresponding to the irradiated position are heated through the radiation of the laser beam. The photothermal conversion layer 4 absorbs the radiated laser beam to convert the optical energy of the laser beam into thermal energy. The thermal energy generated in the photothermal conversion layer 4 evaporates or decomposes part of the thin film 2 adjacent to the photothermal conversion layer 4 to selectively remove the same from the base member 1. Thus, as illustrated in FIG. 2(b), part of the thin film 2 corresponding to the light-radiated region (the light-radiated position) onto which light is radiated is removed from the base member 1 to pattern the thin film 2.

Light is radiated to expose the photothermal conversion layer 4 (and the base member 1 in the embodiment of FIG. 4(a-b) as described below) in a region 3 from which the thin film 2 is removed. Here, before forming the thin film 2 on the photothermal conversion layer 4 (the base member 1), a lyophilic process is performed on the photothermal conversion layer 4 (the base member 1) to expose the lyophilic photothermal conversion layer 4 (base member 1) by radiating light.

The lyophilic process can include a UV radiation process and an $O_2$ plasma process. Since the thin film (the monolayer) 2 made of FAS has lyophobic property, a lyophobic region and a lyophilic region are formed on the base member 1 by patterning the thin film 2.

At this time, by moving the stage 12 along the X-Y plane with respect to the laser beam to be radiated, the removing region 3 are drawn correspondingly to the movement trace of the stage 12. Accordingly, a thin film pattern is formed on the base member 1.

As described above, it is possible to effectively convert the optical energy of radiated light into thermal energy and to apply the thermal energy to the thin film 2 by providing the photothermal conversion layer 4 including the photothermal conversion material on the base member 1. Thus, it is possible to apply enough thermal energy for removing the thin film 2 to the thin film 2 without using an electronic beam or UV rays according to the conventional technology.

Accordingly, it is possible to use various light-radiating devices and to thus effectively remove the thin film 2 from the base member 1 by enough thermal energy such that patterning is performed without using an expensive and large light-radiating device.

In addition, the thin film 2 may be formed of a monomer including a photoinitiator. A monomer may be removed from the base member 1 by radiating laser beam. Thus, it is possible to form the patterned thin film 2 by coating the base member 1 with paint (functional solution) including a photoinitiator and a monomer and radiating light to pattern the thin film and by radiating light corresponding to a photoinitiator to perform polymerization (radiation curing). It is possible to coat the photothermal conversion layer 4 (the base member 1) with the paint including a photoinitiator and a monomer by the above-described common film coating methods (such as the spin coating method, gravure coating method, the reverse roll coating method, the rod coating method, and the micro gravure coating method).

A compound of which the organic thin film 2 is formed preferably has a functional group that causes chemical interactions (such as a hydrogen bond, an electrostatic interaction, an acid-base interaction, a hydrophobic interaction, and a covalent bond) with the base member 1 (photothermal conversion layer 4). The functional group can include a carboxy group, an amino group, a hydroxy group, a thiol group, an isocyanate group, an aldehyde group, a ketone group, an amide group, and an imide group. In addition, the functional group includes a silicon group having an alkoxy group, a halogen group, an alkyl group, and an amino group, or an ionic group such as an ammonium group and a pyridine group.

A relatively weak interaction, such as the hydrogen bond or the acid-base interaction, which can be easily cut off by heat is preferably used as the interaction between the organic thin film 2 and the base member 1 (photothermal conversion layer 4). In order to perform an interaction on the surface on which the organic thin film 2 is formed, it is preferable to perform the above-described lyophilic process such as the UV radiation process, the $O_2$ plasma process, an acid process, and an alkali process.

In this exemplary embodiment, the removing region 3 is drawn on the base member 1 by moving the stage 12 supporting the base member 1. However, the light beam to be radiated may be moved with the base member 1 stopped, and the base member 1 and the light beam may be both moved. Further, when the base member 1 is moved, in place of moving the base member 1n the X-Y plane with the stage 12, the base member may be moved in a state while the base member 1s held by the rotary drum as described above.

Figure 3:
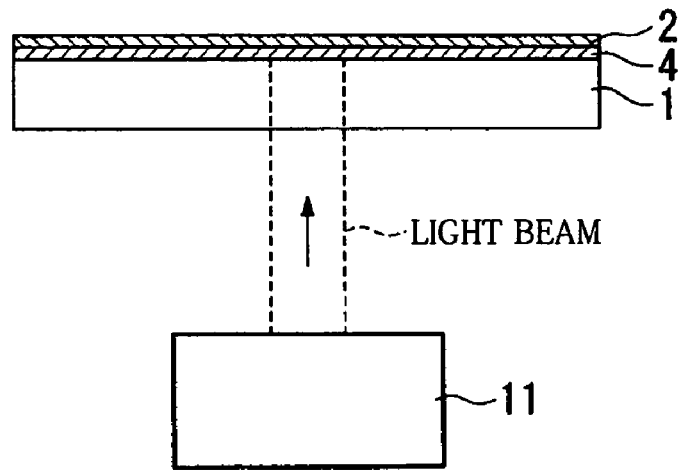
FIG. 3(a-b) is a schematic diagram illustrating another exemplary embodiment of the pattern forming method according to the invention.
Figure 3:
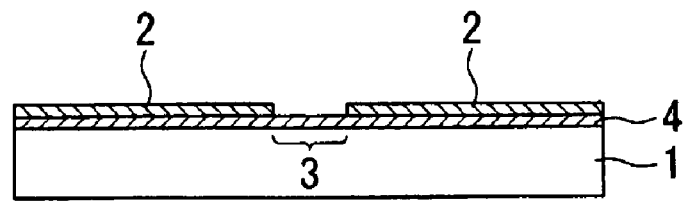

As illustrated in FIG. 3(a-b), when the photothermal conversion layer 4 is provided between the base member 1 and the thin film 2, a laser beam may be radiated onto the base member 1 from the back surface side of the base member 1, on which the thin film 2 is not provided. In this case, the base member 1 is made of a transparent material capable of transmitting a light beam. Accordingly, since it is possible to directly radiate light onto the photothermal conversion layer 4 through the base member 1, the photothermal conversion layer 4 can smoothly convert the optical energy of the radiated light into thermal energy to remove part of the adjacent thin film 2, which corresponds to the light-radiated region (the light-radiated position) such that patterns are formed. Furthermore, by providing the photothermal conversion layer 4 between the base member 1 and the thin film 2 and allowing the thin film 2 to be opened (exposed) externally, part of the thin film 2 that corresponds to the light-radiated region can be smoothly discharged externally.

In a case where the light is radiated to the photothermal conversion layer 4 through the base member 1 from the back surface side of the base member 1, the light may be scattered (diffracted) while passing through the base member 1. Therefore, it is preferable that the scattering condition be measured in advance and the light be radiated from the back surface side of the base member 1 while adjusting the radiation condition on the basis of the measurement result to allow the light to be radiated to the desired positions of the photothermal conversion layer 4. Furthermore, the light may be radiated from both the surface side and the back surface side of the base member 1.

In addition, it may be determined from which side between the surface side of the base member 1 and the other side of the base member 1 light is to be radiated in accordance with the characteristics (material characteristics) of the thin film 2. For example, in the case where the thin film 2 is made of a material that absorbs the wavelength of the radiated light, when light is radiated from the surface side as illustrated in FIG. 2(a-b), the light may be absorbed into the thin film 2 not to reach the photothermal conversion layer 4 under the thin film 2. In such a case, the light is preferably radiated from the other side of the base member 1.

Figure 4:
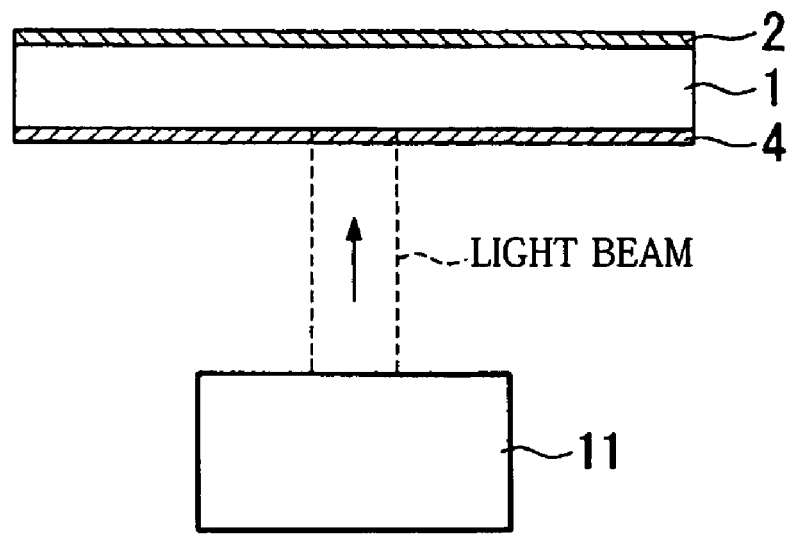
FIG. 4(a-b) is a schematic diagram illustrating another exemplary embodiment of the pattern forming method according to the invention.
Figure 4:
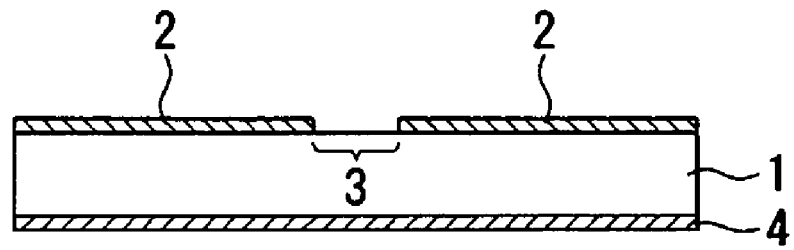

As illustrated in FIG. 4(a-b), the photothermal conversion layer 4 may be provided on the other side of the base member 1 on which the thin film 2 is not provided. In such a case, light is preferably radiated from the other side of the base member 1 (from the side on which the photothermal conversion layer 4 is provided). At this time, in order to effectively transmit the thermal energy generated in the photothermal conversion layer 4 to the thin film 2 provided on the surface side, the thickness and the material of the base member 1 are optimally selected. Also, the photothermal conversion layer 4 may be provided on both the surface side and the other side of the base member 1.

According to the exemplary embodiment described with reference to FIG. 3(a-b) among the respective embodiments, a transparent substance is used as the base member 1. However, according to the embodiment described with reference to FIG. 2(a-b) or FIG. 4(a-b), an opaque substance may be used as the base member 1. According to the embodiment described with reference to FIG. 4(a-b), an opaque substance may be used as the base member 1 as long as the substance has high thermal conductivity.

In the embodiment described with reference to FIGS. 1 to 4(a-b), the photothermal conversion material is provided in a layer (photothermal conversion layer 4) independent from the base member 1 and the thin film 2. However, the photothermal conversion material may be mixed into the base member 1 and the photothermal conversion material may be mixed into the thin film 2. Also in this construction, the optical energy of the radiated laser beam can be converted into the thermal energy, and the thermal energy can be supplied to the thin film 2. In addition, the photothermal conversion layer 4 may be provided on the base member 1, with which a photothermal conversion material is mixed, independent of the base member 1.

On the other hand, in a case where the photothermal conversion layer 4 containing the photothermal conversion material and the thin film 2 are provided separately, the photothermal conversion layer 4 may remain on the base member 1 after the light has been radiated. However, for example, by arranging a functional solution containing a material, which exhibits conductivity by a heat treatment or an optical treatment, in the removing region 3 in which the photothermal conversion layer 4 remains and radiating the light onto the photothermal conversion layer 4 from the back surface side of the base member 1, the material can be allowed to exhibit the conductivity with the heat generated from the photothermal conversion layer 4. Here, examples of the material exhibiting the conductivity by the heat treatment or the optical treatment can include organic silver compound and the like.

When the photothermal conversion layer 4 is provided, it is preferable that the light having the wavelength corresponding to the photothermal conversion material be radiated. That is, since wavelength bands of light to be well absorbed are different for each used photothermal conversion material, the optical energy can be efficiently converted into the thermal energy by radiating the light having a wavelength corresponding to the photothermal conversion material. That is, the photothermal conversion material to be used is selected correspondingly to the radiated light beam. In this embodiment, since a near-infrared semiconductor laser (wavelength: 830 nm) is used as the laser source, it is preferable that a material having a property of absorbing the light of infrared ray through visible ray regions be used as the photothermal conversion material.

A gas generating layer including a gas generating material may be provided between the photothermal conversion layer 4 and the thin film 2 when the photothermal conversion layer 4 is provided between the base member 1 and the thin film 2 and the base member 1 and the thin film 2 when the thin film 2 is formed on the base member 1 to generate gas by light being radiated or by being heated. When the gas generating material absorbs the light or absorbs the thermal energy converted from the optical energy, the gas generating material causes a decomposing reaction and emits nitrogen gas or hydrogen gas, and supplies energy for removing the thin film 2 with the generated gas. Examples of the gas generating material may include one or more materials selected from a group consisting of pentaerythritol tetranitrate (PETN) and trinitrotoluene (TNT).

In addition, an intermediate layer for making the photothermal conversion of the photothermal conversion layer 4 uniform may be provided between the photothermal conversion layer 4 and the thin film 2. Examples of the intermediate layer forming material may include a resin material satisfying the above requirement. The intermediate layer can be formed by applying a resin composite having a predetermined composition to the surface of the photothermal conversion layer 4 by using a known coating method, such as a spin coating method, a gravure coating method, a die coating method, etc. and drying the resin composite. When the laser beam is radiated, the optical energy is converted into the thermal energy with operation of the photothermal conversion layer 4, and the thermal energy is made uniform with operation of the intermediate layer. Therefore, the uniform thermal energy is given to the thin film 2 corresponding to the light radiated area.

Next, a self-assembled film forming method will be described as an example of a method of forming the thin film (monolayer) 2. According to the self-assembled monolayer forming method, a self-assembled monolayer made of an organic monolayer is formed on the surface of the base member 1. Since the organic monolayer has a functional group that can be bonded to the base member 1, a functional group referred to as a lyophilic group or a lyophobic group, which changes the characteristic of the surface of the base member 1 (that controls the surface energy), and a straight or partially branched carbon chain that bonds such functional groups, the organic monolayer is bonded to the base member 1 and is self-assembled to thus form a molecular layer, for example, a monolayer.

Here, the self-assembled monolayer (SAM) is composed of a bonding functional group that can react to the atoms that constitute the underlayer of the base member and other linear molecules and is formed by orienting compounds having extremely high orientation due to the interaction of the linear molecules. Since the self-assembled monolayer is formed by orienting monomolecules, it is possible to make the thickness of the self-assembled monolayer extremely small and to make the molecular level of the self-assembled monolayer uniform. That is, since the same molecules are positioned on the surface of the self-assembled monolayer, it is possible to make the surface of the self-assembled monolayer have uniform and excellent lyophobic or lyophilic property.

Since FAS (fluoroalkylsilane)is used as the compounds having high orientation, the respective compounds are oriented and the self-assembled monolayer is formed such that a fluoroalkyl group is positioned on the surface of the self-assembled monolayer to make the surface of the self-assembled monolayer have uniform lyophobic property. FAS that is a compound that constitutes the self-assembled monolayer includes fluoroalkylsilane such as heptadecafluoro-1,1,2,2 tetrahydroxyltriethoxysilane, heptadecafluoro-1,1,2,2 tetrahydroxyltrimethoxysilane, heptadecafluoro-1,1,2,2 tetrahydroxyltrichlorosilane, tridecafluoro-1,1,2,2 tetrahydrootyltriethoxysilane, tridecafluoro-1,1,2,2 tetrahydrootyltrimethoxysilane, tridecafluoro-1,1,2,2 tetrahydrootyltrichlorosilane, and trifluoropropyltrimethoxylsilane. Such compounds may be individually used and may be used such that two or more kinds are assembled with each other. Also, it is possible to closely adhere the self-assembled monolayer to the substrate and to obtain excellent lyophobic property by using FAS.

FAS is commonly represented by a structural formula $Rn-Si-X_{(4-n)}$. Here, n represents an integer no less than 1 and no more than 3 and X represents a hydrolytic group such as a methoxy group, an ethoxy group, and a halogen atom. R represents a fluoroalkyl group and has a structure of $(CF_3)(CF_2)x(CH_2)y$ (x represents an integer no less than 0 and no more than 10 and y represents an integer no less than 0 and no more than 4). When a plurality of Rs or Xs is bonded to Si, R may be the same as X and may be different from X. A hydrolytic group represented by X is hydrolyzed to form silanol such that the hydrolytic group reacts to the hydroxy group in the bottom surface of the substrate (such as glass and silicon) to be bonded to the substrate by a siloxane bond.

On the other hand, R has a fluoro group, such as $(CF_3)$ on the surface thereof to change the bottom surface of the substrate to a surface that does not get wet (that has low surface energy).

Figure 5:
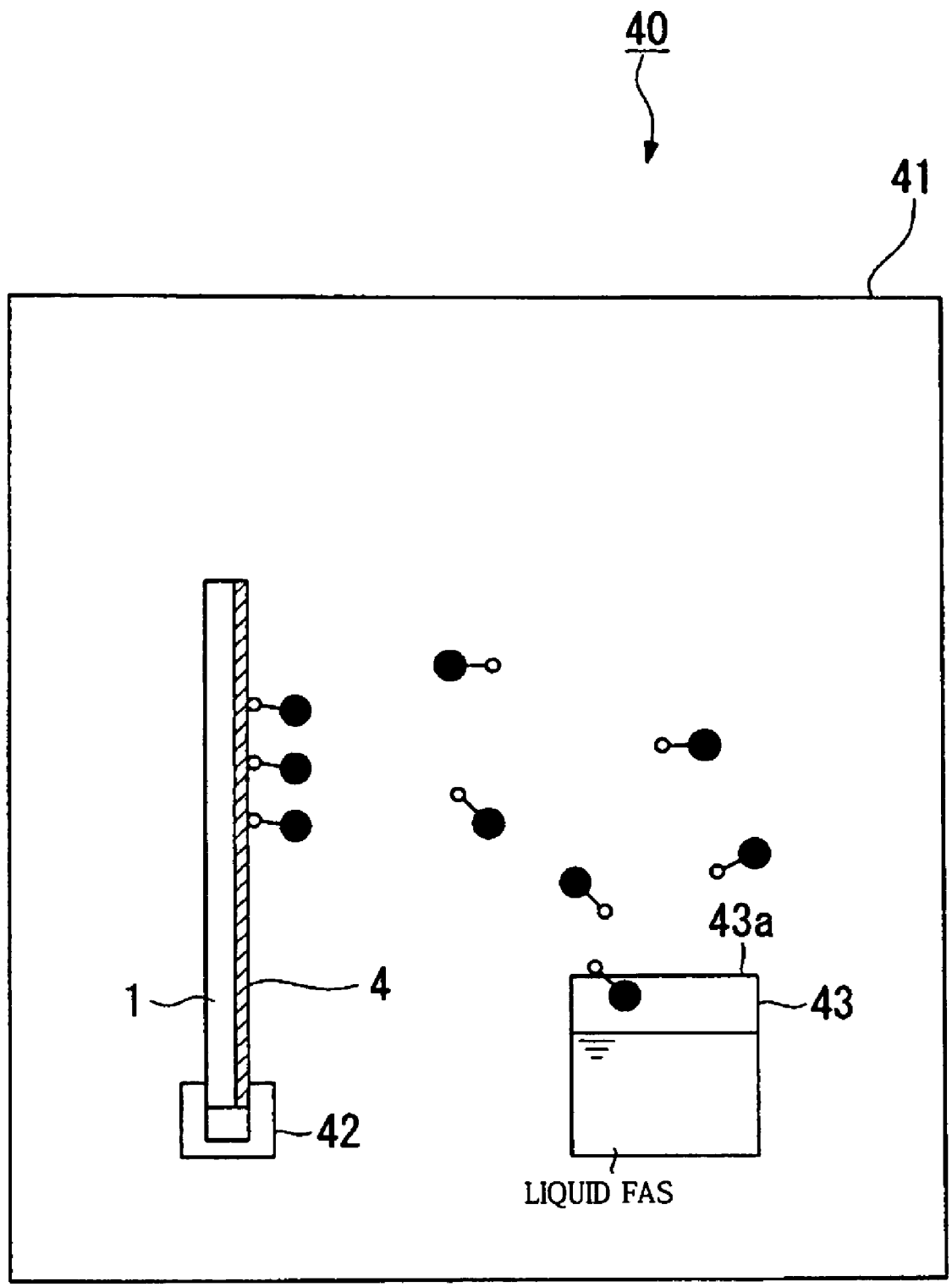
FIG. 5 is a schematic diagram illustrating an example of processes of forming a thin film according to the invention.

FIG. 5 is a schematic block diagram of a FAS processing device 40 that forms a self-assembled monolayer (an FAS layer) made of FAS on the base member 1 (the photothermal conversion layer 4). The FAS processing device 40 forms the self-assembled film made of FAS on the base member 1 (the photothermal conversion layer 4). As illustrated in FIG. 5, the FAS processing device 40 can include a chamber 41, a holder 42 provided in the chamber 41, the holder 42 for holding the base member 1, and a container 43 for accommodating liquid FAS. The base member 1 and the container 43 for accommodating liquid FAS are left in the chamber 41 at a room temperature such that liquid FAS in the container 43 is discharged from an aperture 43a of the container 43 to the chamber 41 in an air phase to form a self-assembled monolayer made of FAS on the base member 1 (the photothermal conversion layer 4)

within two or three days. The entire chamber 41 is maintained at a temperature of 100° C. to form the self-assembled monolayer on the base member 1 (the photothermal conversion layer 4) within three hours. Here, a method of forming the self-assembled monolayer in a state where liquid FAS is in an air phase is described. However, the self-assembled monolayer can be formed in a state where liquid FAS is in a liquid phase. For example, the base member 1 is dipped in solution including material compounds, is washed, and is dried to form the self-assembled monolayer on the base member 1.

A fluoropolymer film formed by a plasma processing method may be used as a lyophobic film. According to the plasma processing method, plasma radiation is performed on the substrate in a normal pressure or under vacuum. Various kinds of gas may be used for the plasma process in consideration of the quality of the surface of the base member 1, on which wiring patterns are to be formed. Processing gas includes 4 fluoromethane, perfluoro hexane, and perfluoro decane.

Figure 6:
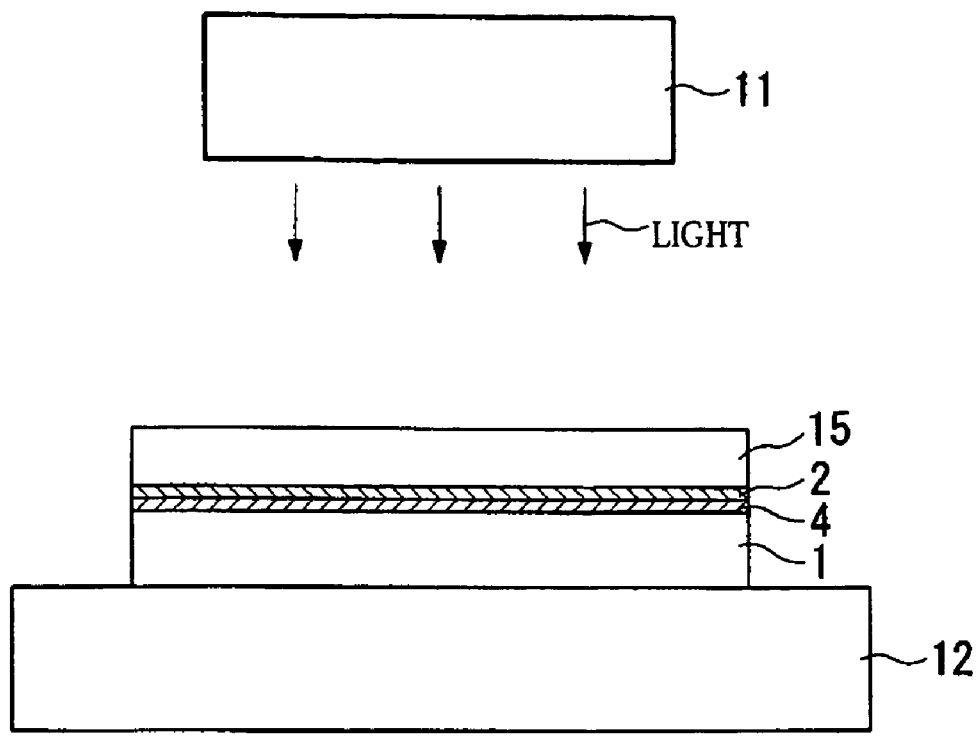
FIG. 6 is a schematic diagram illustrating another exemplary embodiment of the pattern forming apparatus used in the pattern forming method according to the invention.

FIG. 6 illustrates a state in which infrared laser beam is radiated onto the base member 1, on which the FAS process is performed, through a mask 15 having a predetermined pattern. When forming the thin film patterns, as shown in FIG. 6, a light beam may be radiated to a mask 15 having patterns corresponding to the thin film patterns to be formed, thereby radiating the light passing through the mask 15 to the base member 1 having the photothermal conversion layer 4. In FIG. 6, the mask 15 is adhered to the thin film 2 on the base member 1 supported by a stage 12. The light beam emitted from a light source 11 illuminates the mask 15. The light that passes through the mask 15 radiates the base member 1 supported by the stage 12. Part of the thin film 2 is removed by the heat generated by the radiated light to form the thin film pattern. By utilizing the mask 15, the thin film patterns smaller than the diameter of the light beam emitted from the laser source 11 can be formed. On the other hand, as described with reference to FIG. 1, the thin film pattern (removing region 3) is drawn while relatively moving the light beam and the base member 1 such that it is not necessary to manufacture the mask 15.

According to the example illustrated in FIG. 6, light is radiated onto the mask 15 in a state where the mask 15 is adhered to the base member 1. However, light may be radiated onto the mask 15 in a state where the mask 15 and the base member 1 are separated from each other to radiate light onto the base member 1 through the mask 15.

A polybutylene terephthalate (PBT) sheet in which carbon black having a particle diameter of 20 nm is dispersed is provided as the base member 1 such that infrared light (having a wavelength of 172 nm) is radiated onto the sheet to perform optical cleaning and to make the sheet have lyophilic property. Since the infrared light is absorbed around the surface of the sheet such that only the surface onto which light is radiated has lyophilic property, the property of the sheet does not change. Octadecyl amine having lyophobic property is prepared as a material, of which the monolayer is formed. Octadecyl amine is dipped in hexadecane solution (0.1 wt %) at a room temperature for two minutes to form the monolayer. A bottle in which the compound is put and the sheet are provided in a container made of poly 4 fluoroethylene and are held for an hour with a voltage reduced and with the temperature of the entire container raised to 80°. As a result, octadecyl amine is evaporated and is chemical vapor deposited on the sheet to form the organic thin film 2. Then, the sheets are held in a rotary drum, and a laser beam having a wavelength of 830 nm is radiated to the sheet from a near-infrared semiconductor laser having an output power of 11 W while rotating the rotary drum at 50 rpm. Then, by measuring a contact angle to water, it is checked whether the organic thin film 2 of the area corresponding to the light-radiated area is removed or not. The contact angle of the sheet to the water before the light radiation is 90 degrees but the contact angle of the sheet to the water after the light radiation is 10 degrees, whereby it can be confirmed that a part of the organic thin film 2 having the lyophobic property through the laser beam radiation is lost.

Figure 7:
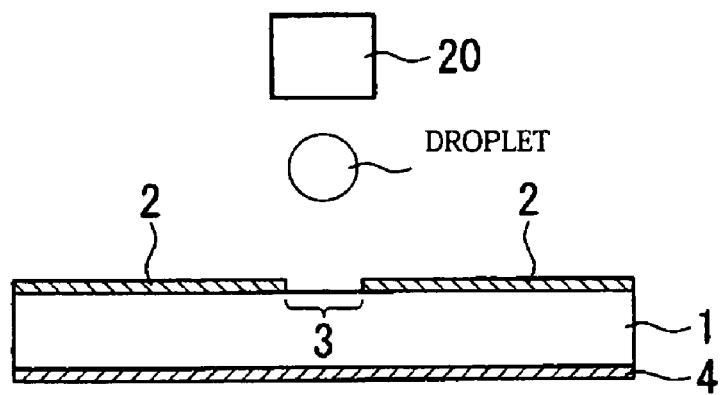
FIG. 7 is a schematic diagram illustrating an exemplary embodiment of a wiring pattern forming method according to the invention.

Hereinafter, a method of forming a wiring pattern on the base member 1 having a thin film pattern formed by the above-described method will be described. FIG. 7 is a schematic view illustrating a method of forming a wiring pattern on the base member 1, on which the pattern of the thin film 2 is formed. In this exemplary embodiment, in order to arrange the wiring pattern forming material on the base member 1, the liquid droplet ejecting method (inkjet method) of ejecting liquid droplets of a functional solution containing the wiring pattern forming material is used. According to the liquid drop discharging method, liquid drops of functional solution including a material for forming a wiring pattern are discharged from a discharge head 20 to the removing region 3 of the thin film 2 in a state where the discharge head 20 faces the base member 1. Here, the thin film (the monolayer) 2 has a lyophobic property and the removing region 3, from which the thin film 2 is removed, has lyophilic property. Also, according to the present embodiment, as illustrated in FIG. 7, the thin film 2 is provided on the surface side of the base member 1 and the photothermal conversion layer 4 is provided on the other side of the base member 1.

Here, examples of the ejection techniques used for the liquid droplet ejecting method may include an electrification control method, a pressurized vibration method, an electrothermal conversion method, an electrostatic attraction method, an electromechanical conversion method, and so on. In the electrification control method, electric charges are given to the material with the electrification electrode, a flying direction of the material is controlled with a deflecting electrode, thereby ejecting the material from the ejecting nozzles. Further, in the pressurized vibration method, an ultra high pressure of about 30 kg/cm$^2$ is applied to the material, thereby ejecting the material to the front end side of the nozzles. Here, when the control voltage is not applied, the material goes straight ahead and is ejected from the ejecting nozzles, and when the control voltage is applied, electrostatic repulsion occurs, the material flies in all directions, and the material is not ejected from the ejecting nozzles. In the electrothermal conversion method, the material is rapidly vaporized to generate bubbles with a heater provided in a space in which the material is stored, and thus the material in the space is ejected by means of the pressure of bubbles. In the electrostatic attraction method, electrostatic attraction is applied to take out the material in a state where meniscuses of the material is formed in the ejecting nozzles by applying a small pressure to a space in which the material is stored. The electromechanical conversion method uses a feature of a piezoelectric element which is deformed with electrical pulse signals, where a pressure is applied to the space storing the material through a flexible material by means of deformation of the piezoelectric element and the material is extruded from the space, thereby ejecting the material from the ejecting nozzles. In addition, a technique of utilizing variation in viscosity of fluid due to an electric field, or a technique of allowing the material to fly with discharged sparks may be employed. The liquid droplet ejecting method has advantages that the waste of material is small and a desired amount of material can be accurately arranged at a desired position. An amount of a droplet of a liquid material to be ejected in the liquid droplet ejecting method may be, for example, 1 to 300 ng. In this exemplary embodiment, the electromechanical conversion method (piezoelectric method) is employed.

Figure 8:
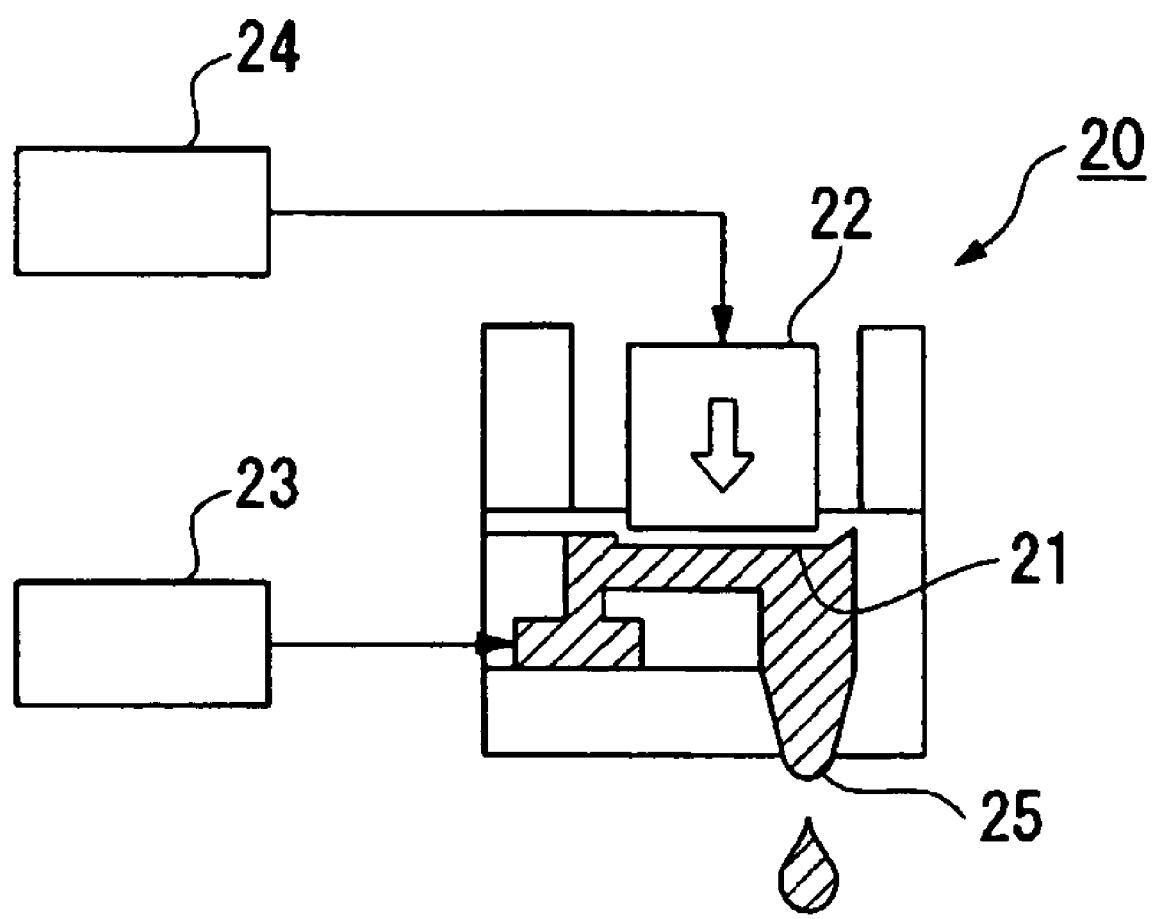
FIG. 8 is a schematic diagram illustrating an ejecting head used in the wiring pattern forming method according to the invention.

FIG. 8 is a diagram illustrating a principle of ejecting a functional solution (liquid material) using the piezoelectric method.

In FIG. 8, the ejecting head 20 can include a liquid chamber 21 for receiving a functional solution (liquid material containing the wiring pattern forming material) and a piezoelectric element 22 provided adjacent to the liquid chamber 21. The liquid chamber 21 is supplied with the functional solution through a supply system 23 including a material tank for storing the functional solution. The piezoelectric element 22 is connected to a driving circuit 24. By applying a voltage to the piezoelectric element 22 through the driving circuit 24 and deforming the piezoelectric element 22, the liquid chamber 21 is deformed, thereby ejecting the functional solution from the ejecting nozzles 25. In this case, by changing the value of the applied voltage, the deformation amount of the piezoelectric element 22 is controlled. Further, by changing a frequency of the applied voltage, the deformation speed of the piezoelectric element 22 is controlled. In the ejection of liquid droplets using the piezoelectric method, there is an advantage that the composition of material is not affected well, because heat is not applied to the material.

Now, a process of forming a wiring pattern will be described. After cleaning the base member 1 using a predetermined solvent, the photothermal conversion layer 4 is provided on the base member 1 by the above-mentioned method. Next, the UV radiation process or the $O_2$ plasma process is performed on the base member 1 to make the base member 1 have lyophilic property. Next, the thin film 2 is formed by the above-described method and light is radiated onto the thin film 2 to form the thin film pattern. Thus, the removing region 3 having lyophilic property is formed in part of the thin film 2 having lyophobic property on the base member 1.

Next, a material arranging process of arranging liquid drops of functional solution including a wiring pattern forming material on the removing region 3 on the base member 1 using the discharge head 20 is performed. Here, an organic silver compound is used as a conductive material constituting the wiring pattern forming material, and the functional solution containing the organic silver compound is ejected using diethylene glycol diethyl ether as a solvent (dispersion medium). In the material arrangement process, as shown in FIG. 7, the liquid droplets of the functional solution containing the wiring pattern forming material are ejected from the ejecting head 20. The discharged liquid drops are arranged on the removing region 3 on the base member 1. At this time, since the removing region 3 having lyophilic property is surrounded by the thin film 2 having lyophobic property, it is possible to prevent the liquid drops from being diffused in regions other than a predetermined position. Due to the lyophobic property of the thin film 2, even if part of the discharged liquid drops is placed on the thin film 2, the liquid drops flow down the removing region 3. Furthermore, since a lyophilic property is given to the removing region 3 to which the base member 1 is exposed, the ejected liquid droplets are more easily diffused to the removing region 3, whereby the functional solution is arranged uniformly in the predetermined positions.

Furthermore, as the functional solution, a dispersion liquid in which conductive fine particles are dispersed in a dispersion medium may be used. As the conductive fine particles, for example, metal fine particles including at least one of gold, silver, copper, aluminum, palladium, and nickel, oxide thereof, and fine particles of conductive polymer or superconductor may be used. The dispersion medium is not specifically limited as long as it can disperse the conductive fine particles and does not cause aggregation. Examples of the dispersion medium may include water, alcohol such as methanol, ethanol, propanol, butanol, etc., hydrocarbon compound such as n-heptane, n-octane, decane, dodecane, tetradecane, toluene, xylene, cymene, durene, indene, dipentene, tetrahydro naphthalene, decahydro naphthalene, cyclohexyl benzene, etc., ether compound such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis (2-methoxy ethyl) ether, p-dioxane, etc., polar compound such as propylene carbonate, γ-butyrolactone, N-methyl-2-pyrrolidone, dimethyl formamide, dimethyl sulfoxide, cyclohexanone, etc., and so on. Among the above compounds, from the view point of a dispersing property of fine particles, a stability of a dispersion liquid, and an easy application to the liquid droplet ejecting method, water, alcohol, hydrocarbon compound, and ether compound are preferable as the dispersion medium, and water and hydrocarbon compound are more preferable as the dispersion medium.

A firing process is performed after the material arrangement process (liquid droplet ejecting process). The conductivity is obtained by performing the firing process to the function solution containing the conductive material. Specifically, the organic silver compound exhibits conductivity by performing the firing process to remove the organic component and allow silver particles to remain. For this reason, at least one of the thermal treatment or the optical treatment as the firing process is performed to the base member 1 having been subjected to the material arrangement process. The thermal treatment or the optical treatment is generally performed in the atmosphere, but may be performed in an inert gas atmosphere of nitrogen, argon, helium, etc. as needed. The process temperature of the thermal treatment or the optical treatment is properly determined considering a boiling point (vapor pressure) of the solvent, a kind or pressure of the atmospheric gas, a dispersion property of the fine particles, thermal behaviors such as oxidation of the organic silver compound, existence or quantity of the coated material, an allowable temperature limit of the base member, and so on. For example, in order to remove the organic components of the organic silver compound, it is necessary to perform the firing process at a temperature of about 200° C. Further, when a substrate made of plastic, etc. is used, it is preferable that the firing process be performed at a temperature higher than the room temperature and lower than 100° C. The conductive material (organic silver compound) having been subjected to the ejection process is converted into conductive wiring patterns due to the remaining silver particles.

An intermediate dry process (or firing process) is performed after the material arrangement process, and by alternately repeating the material arrangement process and the intermediate dry process (firing process) several times, the wiring pattern forming material can be stacked by the removing region 3.

It is possible to remove the photothermal conversion layer 4 provided on the other side of the base member 1 at a predetermined timing, such as after the firing process or a light-radiating process of forming the thin film pattern (the removing region 3). For example, it is possible to remove the photothermal conversion layer 4 from the base member 1 by cleaning the base member 1 by a predetermined solvent. Also, the entire thin film 2 on the base member 1 may be removed at a predetermined timing such as after the material arranging process (the liquid drop discharging process) or after the firing process. For example, it is possible to remove the entire thin film 2 from the base member 1 by radiating a laser beam.

Also, according to the present embodiment, the liquid drop discharging method is used in order to form the wiring pattern. However, the wiring pattern forming material may be arranged on the removing region 3 by a plating method.

Figure 9:
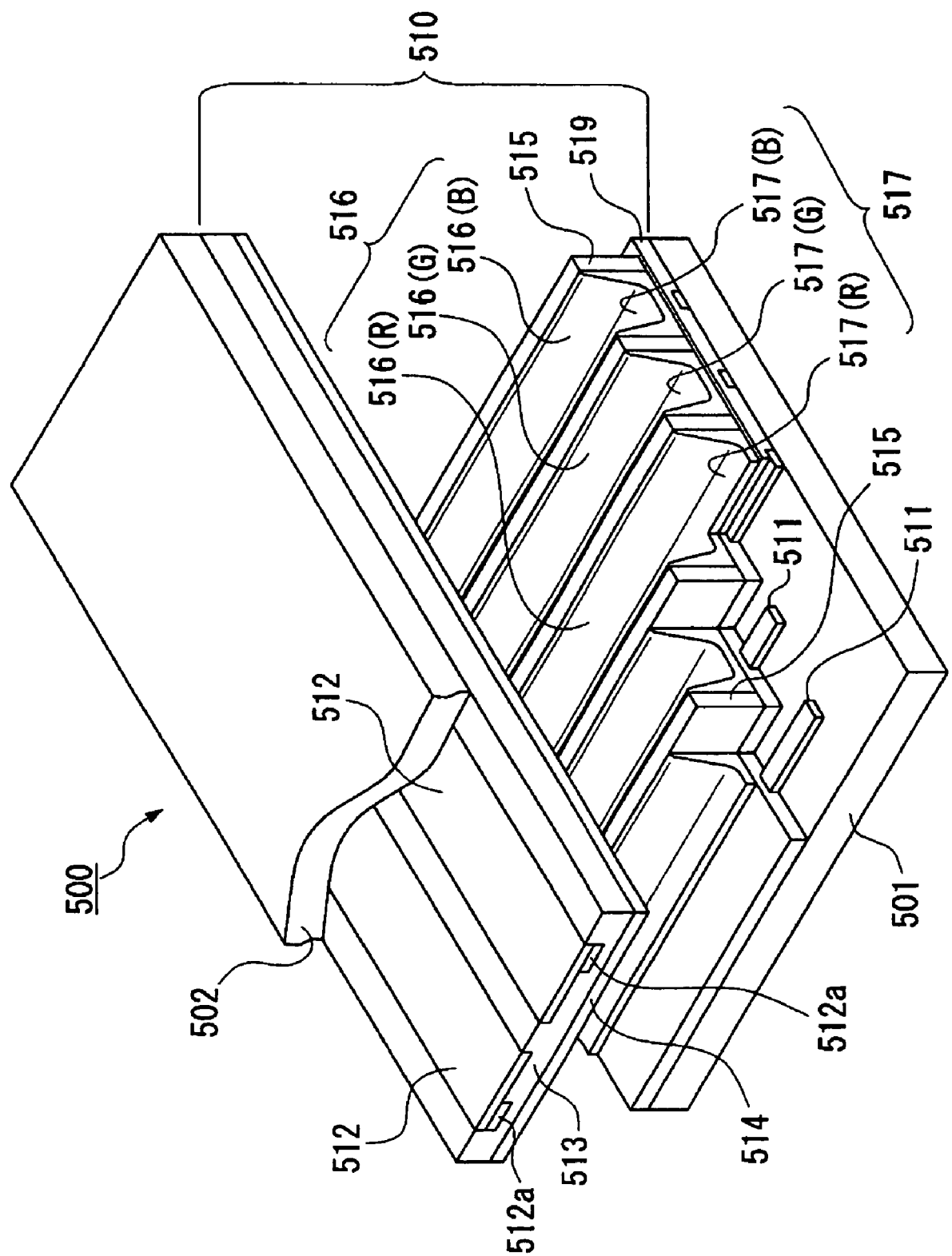
FIG. 9 is an exploded perspective view of a plasma display device illustrating an example of an electro-optical device having the wiring patterns formed using the wiring pattern forming method according to the invention.

Next, as an example of an electro-optical device having the wiring patterns formed using the wiring pattern forming method according to the present invention, a plasma display device will be described with reference to FIG. 9. FIG. 9 is an exploded perspective view illustrating the plasma display device 500 of which address electrodes 511 and bus electrodes 512a are manufactured. The plasma display device 500 substantially comprises a glass substrate 501 and a glass substrate 502 opposed to each other and a discharge display unit 510 formed between the glass substrates.

The discharge display unit 510 includes a plurality of discharge chambers 516, and a group consisting of three discharge chambers 516 of a red discharge chamber 516(R), a green discharge chamber 516(G), and a blue discharge chamber 516(B) of the plurality of discharge chambers 516 forms one pixel. The address electrodes 511 are formed in a stripe pattern at a predetermined interval on the top surface of the (glass) substrate 501, a dielectric layer 519 is formed to cover the address electrodes 511 and the top surface of the substrate 501, and partitioning walls 515 are formed along the address electrodes 511 to be arranged between the address electrodes 511 and 511 on the dielectric layer 519. The partitioning walls 515 are divided at a predetermined interval in a direction perpendicular to the address electrodes 511 at predetermined positions of the longitudinal direction (not shown), and rectangular areas are formed basically by the partitioning walls adjacent to both widthwise sides of the address electrodes 511 and the partitioning walls extending in the direction perpendicular to the address electrodes 511, so that the discharge chambers 516 are formed to correspond to the rectangular areas and a group of three rectangular areas constitutes a pixel. Fluorescent materials 517 are arranged inside the rectangular areas defined by the partitions 515. The fluorescent materials 517 emit one fluorescent light component of red, green, and blue. The red fluorescent material 517(R) is disposed on the bottom of the red discharge chamber 516(R), the green fluorescent material 517(G) is disposed on the bottom of the green discharge chamber 516(G), and the blue fluorescent material 517(B) is disposed on the bottom of the blue discharge chamber 516(B).

Next, a plurality of transparent display electrodes 512 made of ITO are formed in a stripe pattern at a predetermined interval in the direction perpendicular to the address electrodes 511 on the glass substrate 502 side, and bus electrodes 512a made of metal to assist the high-resistance ITO are also formed together. A dielectric layer 513 is formed to cover the transparent display electrodes and the bus electrodes, and a protective film 514 made of MgO, etc. is formed thereon. Two substrates of the substrate 501 and the substrate 502 are bonded to allow the address electrodes 511, . . . and the display electrodes 512, . . . to be perpendicular each other, and the discharge chambers 516 are formed by exhausting spaces surrounded with the substrate 501, the partitioning walls 515, and the protective film 514 formed on the glass substrate 502 side and injecting rare gas thereto. The display electrodes 512 formed on the glass substrate 502 are arranged two every discharge chamber 516. The address electrodes 511 and the display electrodes 512 are connected to an alternating power source not shown, and the fluorescent materials 517 positioned at required positions in the discharging display unit 510 are excited to emit the fluorescent light by supplying power to the respective electrodes, so that a color display can be performed.

In this example, the address electrodes 511 and the bus electrodes 512a are formed using the wiring pattern forming method according to the present invention. The address electrodes 511 and the bus electrodes 512a are formed by ejecting a functional solution in which metal colloid materials (for example, gold colloid or silver colloid) or conductive fine particles (for example, metal fine particles) are dispersed and drying and burning the functional solution, because it is advantageous for patterning. The fluorescent materials 517 can be formed by ejecting with the ejection head 20 a functional solution obtained by dissolving the fluorescent material in a solvent or dispersing the fluorescent material in a dispersion medium and drying and burning the functional solution.

Next, an exemplary process of manufacturing a color filter of a liquid crystal display device using the thin film according to the exemplary invention will be described with reference to FIG. 10(a-f). The thin film according to the present embodiment is not made of a monolayer but of an organic thin film having a predetermined height (thickness) and constitutes banks (black matrices) that partition a predetermined region on the base member. First, as shown in FIG. 10(a), black matrices (banks) 52 are formed on one surface of a transparent substrate (base member) P. The black matrices 52 partition color filter forming areas and are formed using the bank forming method according to the present invention. When the black matrices (banks) are formed, a black sublimation material is used together with a photoinitiator and a monomer to cure the black matrices in the next light-radiating process.

Next, as shown in FIG. 10(b), the liquid droplets 54 of a functional solution for forming the color filters from the ejecting head 20 are ejected and the liquid droplets are deposited in filter elements 53. The quantity of the functional solution 54 to be ejected is set to be sufficient in consideration of decrease in volume of the functional solution during the heating process (drying and firing process).

After the liquid droplets 54 are filled in all the filter elements 53 on the substrate P in this way, the substrate P is heated to a predetermined temperature (for example, about 70° C.) using a heater. Through this heating process, the solvent of the functional solution is vaporized and the volume of the functional solution is decreased. When the volume decrease is severe, the liquid droplet ejecting process and the heating process are repeated until a film thickness sufficient for a color filter is obtained. Through this process, the solvent included in the functional solution is vaporized and only solid components (functional material) included in the functional solution finally remains and forms a film, so that the color filters 55 shown in FIG. 10(c) are obtained.

Next, in order to planarize the substrate P and protect the color filters 55, as shown in FIG. 10(d), a protective film 56 is formed to cover the color filters 55 or the black matrices 52 on the substrate P. The protective film 56 can be formed using a spin coating method, a roll coating method, a ripping method, and the like, and may be formed using the ejecting apparatus, similarly to formation of the color filters 55. Next, as shown in FIG. 10(e), a transparent conductive film 57 is formed on the whole surface of the protective film 56 using the sputtering method or a vacuum deposition method. Thereafter, the transparent conductive film 57 is patterned to pattern pixel electrodes 58 correspondingly to the filter elements 53, as shown in FIG. 10(f). On the other hand, in the case where TFTs (Thin Film Transistors) are used for driving a liquid crystal display panel, the above patterning process can be omitted. Since the ejecting head 20 is used for manufacturing the color filters, the color filter material can be ejected continuously without any problem, so that it is possible to form the color filters well and to enhance productivity.

Figure 11:
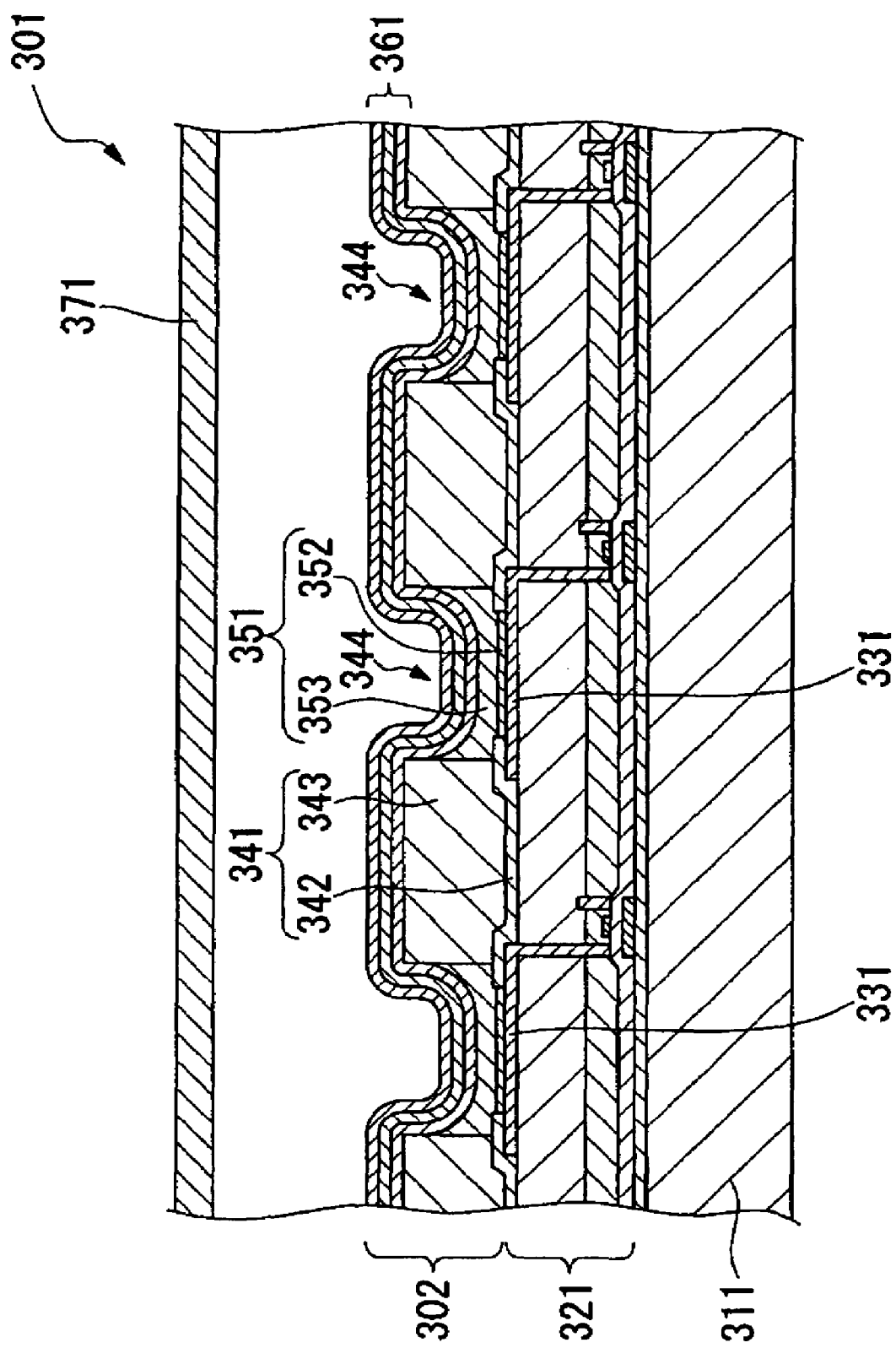
FIG. 11 is a diagram illustrating an example of the electro-optical device manufactured using the thin film formed through the pattern forming method according to the invention, where an example of a process of forming a side cross-sectional view of an organic EL display device is shown.

Next, a process of manufacturing an organic EL display device using the banks according to the invention will be described with reference to FIG. 11. Also, the thin film according to the exemplary embodiment is not made of a monolayer but of an organic thin film having a predetermined height (thickness) and constitutes banks (black matrices) that partition a predetermined region on the base member. FIG. 11 is a side cross-sectional view of an organic EL display device of which some constituent elements are formed with the ejecting head 20. First, an approximate structure of the organic EL display device will be described. The organic EL display device to be formed here is an exemplary embodiment of the electro-optical device according to the present invention.

As shown in FIG. 11, in the organic EL display device 301, an organic EL element section 302 including a substrate (base member) 311, a circuit element part 321, pixel electrodes 331, banks 341, light-emitting elements 351, a negative electrode 361 (counter electrode) and a sealing substrate 371 is connected to wires of a flexible substrate (not shown) and a driving IC (not shown). The circuit element section 321 is formed on the substrate 311, and a plurality of pixel electrodes 331 are arranged on the circuit element section 321. The banks 341 are formed in a lattice shape between the pixel electrodes 331, and the light-emitting elements 351 are formed in recessed openings 344 generated by the banks 341. The negative electrode 361 is formed on the whole top surface of the banks 341 and the light-emitting elements 351, and the sealing substrate 371 is stacked on the negative electrode 361.

Each bank 341 can include a first bank 342 and a second bank 343 stacked thereon. The banks 341 are formed using the thin film pattern forming method according to the invention.

The process of manufacturing the organic EL display device 301 including the organic EL elements can include a bank forming process of forming the banks 341, a plasma process of making suitable formation of the light-emitting elements 351, a light-emitting element forming process of forming the light-emitting elements 351, a counter electrode forming process of forming the negative electrode 361, and a sealing process of stacking the sealing substrate 371 on the negative electrode 361 and sealing them.

In the light-emitting forming process, the light-emitting elements 351 are formed by forming hole injection layers 352 and light-emitting layers 353 in the recessed openings 344, that is, on the pixel electrodes 331, and a hole injection forming process and a light-emitting layer forming process are included. The hole injection layer forming process includes a first ejection process of ejecting a first functional solution for forming the hole injection layers 352 onto the pixel electrodes 331 and a first dry process of drying the first functional solution ejected and forming the hole injection layers 352, and the light-emitting layer forming process includes a second ejection process of ejecting a second functional solution for forming the light-emitting layers 353 onto the hole injection layers 352 and a second dry process of drying the second functional solution ejected and forming the light-emitting layers 353.

In the process of forming the light-emitting element, the ejecting head 20 is used in the first ejection process in the process of forming the hole injection layer and the second ejection process in the process of forming the light-emitting layer.

Figure 12:
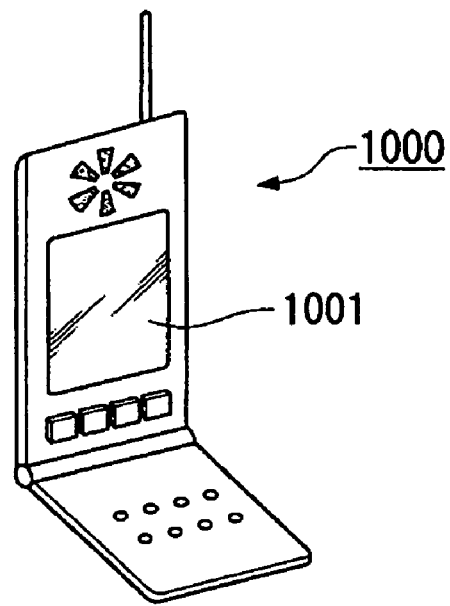
FIG. 12(a-c) is a diagram illustrating an example of an electronic apparatus having the electro-optical device according to the invention.
Figure 12:
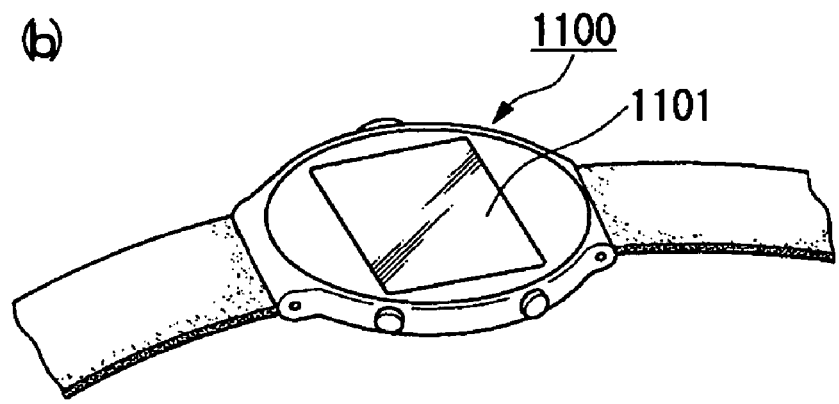
Figure 12:
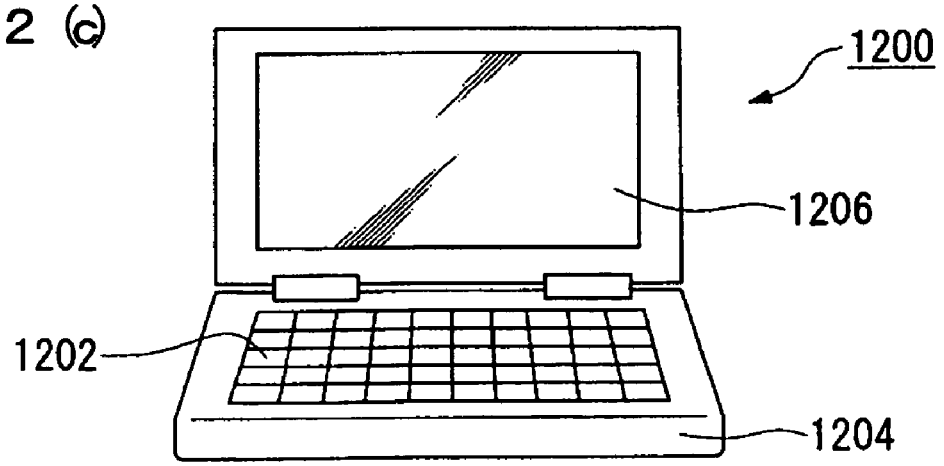

Now, applications of an electronic apparatus having the electro-optical device (a liquid crystal display device, an organic EL display device, plasma display device, etc.) will be described. FIG. 12(a) is a perspective view illustrating an example of a mobile phone. In FIG. 12(a), reference numeral 1000 denotes a mobile phone body, and reference numeral 1001 denotes a display unit employing the electro-optical device. FIG. 12(b) is a perspective view illustrating an example of a wrist watch type electronic apparatus. In FIG. 12(b), reference numeral 1100 denotes a watch body, and reference numeral 1101 denotes a display unit employing the electro-optical device. FIG. 12(c) is a perspective view illustrating an example of a mobile data processing apparatus, such as a word processor, a PC, and the like. In FIG. 12(c), reference numeral 1200 is a data processing apparatus, reference numeral 1202 denotes an input unit, such as a keyboard, reference numeral 1204 denotes a data processing apparatus body, and reference numeral 1206 denotes a display unit employing the electro-optical device. Since the electronic apparatuses shown in FIGS. 12(a) to 12(c) include the electro-optical device according to the above embodiments, an electronic apparatus having a display unit with excellent display quality and a bright screen can be embodied.

In addition to the aforementioned examples, examples of the electronic apparatuses can further include a liquid crystal television, a view finder type or monitor direct vision-type video tape recorder, a car navigation apparatus, a pager, an electronic note, a calculator, a word processor, a work station, a television phone, a POS terminal, electronic paper, an apparatus having a touch panel and the like. The electro-optical device of the present invention can be also applied to the display unit of the above-mentioned electronic apparatuses.

Figure 13:
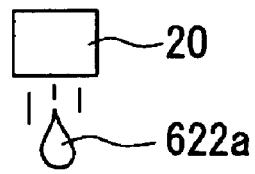
FIG. 13(a-d) is a schematic diagram illustrating processes of forming a micro lens using the thin film pattern according to the invention.
Figure 13:
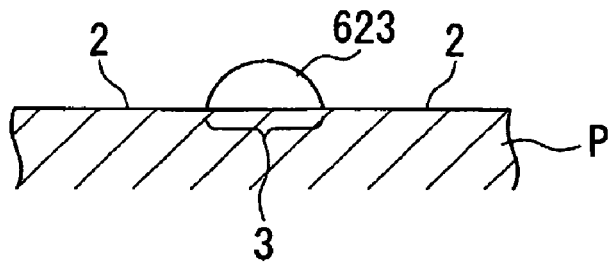
Figure 13:
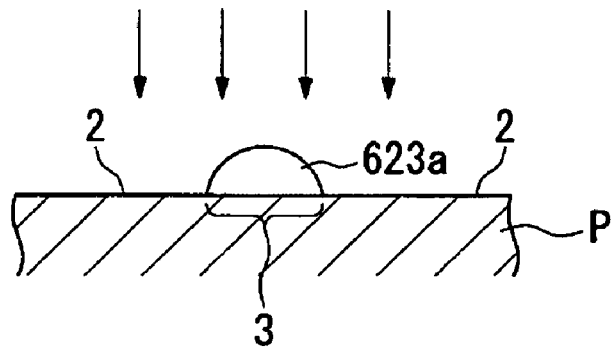
Figure 13:
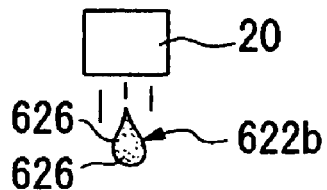
Figure 13:
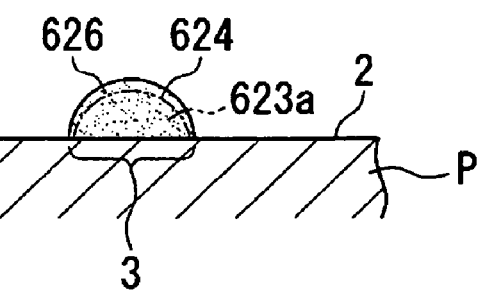
Figure 13:
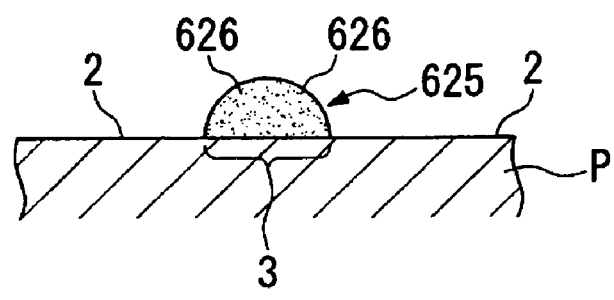

FIG. 13(a-d) is a diagram illustrating an example of processes of forming micro lenses using the thin film pattern according to the invention. The thin film according to the exemplary embodiment is made of a monolayer that is made of an FAS film and that has lyophobic property.

According to the exemplary embodiment, first, as illustrated in FIG. 13(a), a liquid drop 622a made of light transmissive resin is discharged from the discharge head 20 onto the substrate (the base member) P to coat the substrate P with the liquid drop 622a. When the liquid drop 622a is discharged from the discharge head 20, prior to discharging the liquid drop 622a, the thin film pattern according to the present invention is formed on the substrate P such that the liquid drop 622a is arranged in the removed region 3 having lyophilic property.

When the obtained micro lens is applied to an optical film for a screen, a light transmissive sheet or a light transmissive film made of cellulose resin, such as acetyl cellulose and propyl cellulose and transparent resin (light transmissive resin), such as poly vinyl chloride resin, polyethylene, polypropylene, polyester is used as the substrate P. A substrate made of a transparent material (a light transmissive material), such as glass, polycarbonate, polyarylate, polyethersulfone, amorphous polyolefin, polyethylene terephthalate, and poly methyl methacrylate can be used as the substrate.

Thermoplastic or thermosetting resin, such as acryl resin such as poly methyl methacrylate, poly hydroxy ethyl methacrylate, and poly cyclo hexyl methacrylate, aryl resin such as poly diethylene glycol bis aryl carbonate, and polycarbonate, methacryl resin, polyurethane resin, polyester resin, poly vinyl chloride resin, poly vinyl acetate resin, cellulose resin, polyamide resin, fluoro resin, polypropylene resin, and polystyrene resin may be used as the light transmissive resin. One among the above is used or a plurality of kinds are mixed with each other to be used.

According to the exemplary embodiment, radiation hardening resin is used as the light transmissive resin. The radiation hardening resin is obtained by mixing a photoinitiator such as a biimidazole compound with the above-described light transmitive resin such that radiation hardening property is obtained by combining the photoinitiator with the light transmissive resin. Radiation rays include visible rays, ultraviolet (UV) rays, far ultraviolet (UV) rays, X-rays, and electronic rays. In particular, UV rays are commonly used.

One radiation hardening light transmissive resin liquid drop 622a or a plurality of radiation hardening light transmissive resin liquid drops 622a is discharged onto the substrate P in accordance with the size of a desired single micro lens. Then, light transmissive resin 623 made of the liquid drops 622 becomes convex (roughly hemispherical) as illustrated in FIG. 13(a) due to surface tension. Accordingly, a predetermined amount of light transmissive resin is discharged to a single micro lens to be formed to coat the micro lens with the light transmissive resin and the coating process is performed by the desired number of micro lenses such that radiation rays such as UV rays are radiated onto the light transmissive resin 623 and the light transmissive resin 623 is hardened as illustrated in FIG. 13(b) to form a hardened body 623a. The amount of the liquid drop 622a discharged from the discharge head 20 varies in accordance with the discharge head 20 or a discharged ink material, however, is commonly 1 pL to 20 pL.

Next, as illustrated in FIG. 13(c), a desired number of liquid drops 622b that disperse a plurality of light-diffusing corpuscles 626 onto the respective hardened bodies 623a are discharged from the discharge head 20 to be attached to the surfaces of the hardened bodies 623a. Corpuscles, such as silica, alumina, titanium dioxide, calcium carbonate, aluminum hydroxide, acryl resin, organic silicon resin, polystyrene, urea resin, and a formaldehyde condensation product can be used as the light-diffusing corpuscles 626. One among the above is used or a plurality of kinds are mixed with each other to be used. For the light-diffusing corpuscles 626 to have enough light-diffusing property, when the corpuscles are light transmissive, it is necessary that the refractive index of the corpuscles be significantly different from the refractive index of the light transmissive resin. Thus, when the light-diffusing corpuscles 626 are light transmissive, the light-diffusing corpuscles 626 are properly selected and used in accordance with the used light transmissive resin.

The light-diffusing corpuscles 626 are previously dispersed by a proper solvent (such as a solvent used for the light transmissive resin) to be adjustable in ink that can be discharged from the discharge head 20. At this time, the surfaces of the light-diffusing corpuscles 626 are preferably coated with a surface active agent or solution resin to improve the dispersion property of the light-diffusing corpuscles 626 in the solvent. By performing such a process, it is possible to make the light-diffusing corpuscles 626 easily discharged from the discharge head 20. The surface active agent for performing a surface process includes a cationic surface active agent, an anionic surface active agent, a nonionic surface active agent, an amphoteric surface active agent, a silicon surface active agent, and fluoro resin surface active agent, which are properly selected and used in accordance with the kind of light-diffusing corpuscles 624.

The light-diffusing corpuscles 626 preferably have a particle diameter of no less than 200 nm and no more than 500 nm. This is because, when the particle diameter is in such a range, it is possible to obtain excellent light-diffusing property by the light-diffusing corpuscles 626 having the particle diameter of no less than 200 nm and to easily discharge the light-diffusing corpuscles 626 having the particle diameter of no more than 500 nm from the nozzles of a discharge head 1.

The same discharge head as the discharge head 20 that discharges the light transmissive resin liquid drops 622a or discharge heads other than the discharge head 20 may be used to discharge the liquid drops 622b in which the light-diffusing corpuscles 626 are dispersed. When the same discharge head is used, it is possible to simplify the structure of the device including the discharge head 20. On the other hand, when the discharge head other than the discharge head 20 are used, since it is possible to use exclusive heads for the respective functional solutions (such as the functional solution made of the light transmissive resin and the functional solution made of the corpuscles 24), it is not necessary to clean the head when the functional solution, with which the hardened body 623a is coated, is changed such that it is possible to improve productivity.

Then, a heating process, a voltage-reducing process, or a heating and voltage-reducing process is performed to evaporate the solvent in the liquid drops 622b in which the light-diffusing corpuscles 624 are dispersed. Then, the surface of the hardened body 623a is softened by the solvent of the liquid drop 622b and the light-diffusing corpuscles 626 are attached to the surface of the hardened body 623a such that the solvent is evaporated to re-harden the surface of the hardened body 623a. At the same time, the light-diffusing corpuscles 624 are fixed to the surface of the light transmissive resin hardened body 623a. The light-diffusing corpuscles 624 are fixed to the surface of the hardened body 623a to obtain a micro lens 625 according to the present invention formed by dispersing the light-diffusing corpuscles 624 in the surface of the hardened body 623a as illustrated in FIG. 13(d).

Since a convex (roughly hemispherical) micro lens 625 made of the light transmissive resin 623 and the light-diffusing corpuscles 624 is formed using an inkjet method, it is not necessary to use a mold unlike in the case where a molding method or an eject molding method is used and it is possible to prevent materials from being wasted.

Thus, it is possible to reduce manufacturing cost. Since the obtained micro lens 625 is convex (roughly hemispherical), it is possible to almost uniformly diffuse light at a large angle (in a direction) such as 360° using the micro lens. Also, since the light-diffusing corpuscles 626 are complicated, it is possible to make the obtained micro lens have high light-diffusing property.

Figure 14:
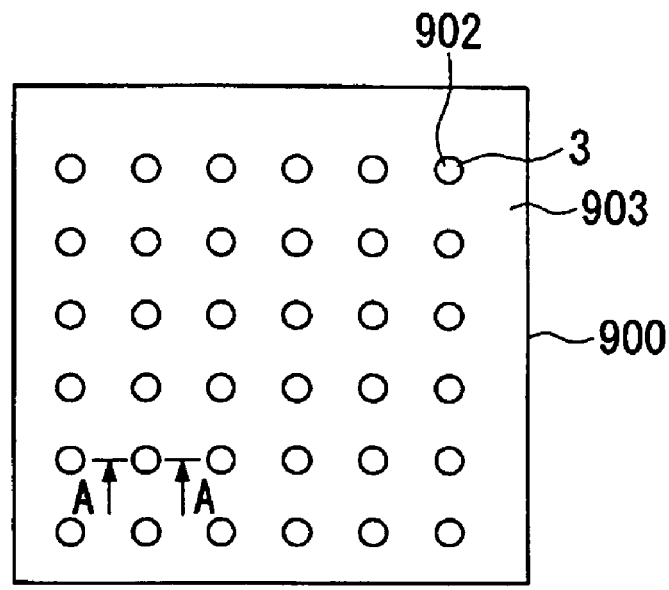
FIG. 14(a-c) is a schematic diagram illustrating an embodiment of a DNA chip formed using the thin film pattern according to the invention.
Figure 14:
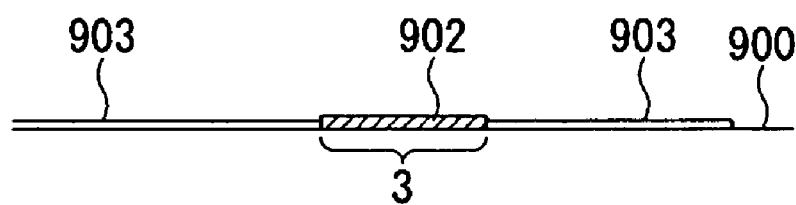
Figure 14:
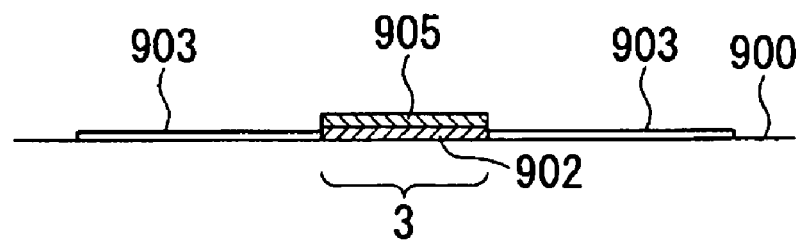

FIG. 14(a-c) is a diagram illustrating an exemplary embodiment of forming a DNA chip as an inspector using the thin film pattern according to the invention, where FIG. 14(a) is a plan view, and FIGS. 14(b) and 14(c) are cross-sectional views taken along the line A-A. Technologies for the DNA chip are disclosed in Japanese Unexamined Patent Application Publication No. 10-168386, and Japanese Unexamined Patent Application Publication No. 2000-232883, etc.

In FIGS. 14(a) and 14(b), in the DNA chip according to the exemplary embodiment, a reaction film 902 is provided on a base member 900. According to the exemplary embodiment, a thin film 903 having lyophobic property is provided around the reaction film 902. The thin film 903 is made of a monolayer having lyophobic property. As the reactant for forming the reaction film 902 for the DNA chip, for example, DNA pieces are used.

The DNA pieces of several tens to several hundreds of kinds of which gene sequences are found out in advance are contained in a solution and then fixed to the base member 900. In the DNA chip of this example, as shown in FIG. 13(c), the light is radiated from the rear side of the base member 900, passes through the reaction film 902, and then is extracted. During utilization of the DNA chip of this example, liquid gene samples 905 are prepared and are disposed on the chip. When a gene corresponding to the samples exists, the gene reacts to the reaction film 902 through a capture reaction, a base sequence thereof is specified, and fluorescent light is emitted by a synthesized fluorescent dye.

In order to manufacture the DNA chip, first, the thin film 903 is formed on the base member 900. Next, the thin film pattern having the removing region 3 is formed based on the thin film pattern forming method according to the invention. Then, a reactant is discharged from the discharge head 20 to the removing region 3 to form the reaction film 902 on the base member 900. Thus, the DNA chip is manufactured.

Also, the reaction film 902 may be previously provided on the entire surface of the base member 900 having the photothermal conversion layer and light may be radiated onto the reaction film 902 to remove the reaction film 902 corresponding to the light-radiated region such that patterning is performed and then, the reaction film 902 may be discretely arranged on the base member 900. A gene sample 905 is preferably arranged with respect to the discretely arranged reaction film 902.

What is claimed is:

1. A pattern forming method comprising:
providing a thin film on a base member, a photothermal conversion material being provided in a photothermal conversion layer that is independent of the thin film and the base member, the photothermal conversion material converts a laser beam into thermal energy; and
radiating the laser beam onto a laser beam-radiated region of the base member to remove the thin film from the base member corresponding to the laser beam-radiated region so that the thin film is patterned,
the laser beam being radiated to the laser beam-radiated region of the base member through a mask having a predetermined pattern, the laser beam being radiated from a surface side of the base member on which the film is not provided.

2. The pattern forming method according to claim 1, the thin film being an organic thin film.

3. The pattern forming method according to claim 1, the thin film being a monolayer.

4. The pattern forming method according to claim 1, the film being a monomer including a photoinitiator.

5. The pattern forming method according to claim 1, the photothermal conversion layer being provided on one surface side of the base member on which the thin film is provided.

6. The pattern forming method according to claim 1, the photothermal conversion layer being provided between the base member and the thin film.

7. The pattern forming method according to claim 1, the photothermal conversion layer being provided on another surface side of the base member on which the thin film is not provided.

8. The pattern forming method according to claim 1, the radiation of the laser beam being performed while relatively moving the base member with respect to the laser beam.

* * * * *